United States Patent [19]

Shimokawa et al.

[11] Patent Number: 4,908,333
[45] Date of Patent: Mar. 13, 1990

[54] PROCESS FOR MANUFACTURING A SEMICONDUCTOR DEVICE HAVING A CONTACT WINDOW DEFINED BY AN INCLINED SURFACE OF A COMPOSITE FILM

[75] Inventors: Kimiaki Shimokawa; Hiroshi Hoga, both of Tokyo, Japan

[73] Assignee: Oki Electric Industry Co., Ltd., Tokyo, Japan

[21] Appl. No.: 168,315

[22] Filed: Mar. 17, 1988

[30] Foreign Application Priority Data

Mar. 24, 1987 [JP] Japan ................................. 62-67934

[51] Int. Cl.$^4$ .................. H01L 21/285; H01L 21/318
[52] U.S. Cl. .................................. 437/195; 437/241; 437/981; 156/646; 156/657
[58] Field of Search .............................. 437/203–228, 437/947, 981, 195; 156/643, 646, 657, 659.1, 653; 148/DIG. 161

[56] References Cited

U.S. PATENT DOCUMENTS

| | | | |
|---|---|---|---|
| 3,966,514 | 6/1976 | Feng et al. | 437/67 |
| 4,002,512 | 1/1977 | Lim | 437/243 |
| 4,142,004 | 2/1979 | Hauser Jr. et al. | 437/009 |
| 4,369,090 | 1/1983 | Wilson et al. | 156/644 |
| 4,439,270 | 3/1984 | Powell et al. | 437/228 |
| 4,684,436 | 8/1987 | Burns et al. | 156/643 |
| 4,720,395 | 1/1988 | Foster | 437/241 |

FOREIGN PATENT DOCUMENTS

| | | | |
|---|---|---|---|
| 58-64032 | 4/1983 | Japan | 437/981 |
| 59-232443 | 12/1984 | Japan | 437/981 |
| 0227443 | 12/1985 | Japan | |
| 61-166031 | 7/1986 | Japan | 437/981 |
| 61-166127 | 7/1986 | Japan | 437/981 |

OTHER PUBLICATIONS

"Influence of DC Bias Sputtering During Aluminum Metallization", James F. Smith, Solid State Technology, Jan. 1984, pp. 135–138.

Primary Examiner—Olik Chaudhuri
Attorney, Agent, or Firm—Wenderoth, Lind & Ponack

[57] ABSTRACT

An insulating film formed under a conductive film has a side wall defining a contact window and having the shape of a gently inclined curvilinear surface, so that the insulating film is able to provide a sufficient step coverage in the contact window. The insulating film is formed over the surface of a semiconductor substrate or a first conductive film. The insulating film has an increasing or decreasing refractive index over the depth thereof. A contact window is formed by selectively removing a portion of the insulating film using a photoresist pattern formed over the surface of the insulating film. A structure thus formed is subjected to an etching process capable of etching the upper layer of the insulating film at an etching rate higher than that for the lower layer of the same to etch the side wall of the insulating film defining the contact window into a gently inclined curvilinear surface, and then the photoresist pattern is removed. A second conductive film is formed over the surface of a structure formed in the preceding step.

4 Claims, 3 Drawing Sheets

PROCESS FOR MANUFACTURING A SEMICONDUCTOR DEVICE HAVING A CONTACT WINDOW DEFINED BY AN INCLINED SURFACE OF A COMPOSITE FILM

BACKGROUND OF THE INVENTION

1. Field of the Invention

The present invention relates to a process of manufacturing a semiconductor device and, more particularly, to a process of forming a conductive film having improved coverability characteristics.

2. Description of the Prior Art

To electrically connect a conductive film to a semiconductor substrate or to another conductive film in an integrated circuit, a portion of an insulating film isolating the conductive film from the semiconductor substrate or other conductive film is removed to form a contact window. The improvement of the step coverage of the conductive film in the contact window is essential to improving the reliability of the integrated circuit.

FIGS. 3a to 3c show different stages of a conventional process of manufacturing a conductive film.

Referring to FIG. 3a, an SiO$_2$ (silicon dioxide) film 12 is formed over the surface of a silicon substrate 11 by using a thermal oxidation process. A conductive film 13 is formed over the surface of the SiO$_2$ film 12 by using a sputtering process. The conductive film 13 is, for example, an aluminum film or a polycrystalline silicon film. An insulating film 14 having a thickness of 8000 Å is formed over the surface of the conductive layer 13 by using a CVD chemical vapor deposition) process. The insulating film 14 is, for example, a phosphorus silica glass (PSG) film. A photoresist pattern 15 is formed over the surface of the insulating film 14 by using a photolithographic process.

Referring to FIG. 3b, a portion of the insulating film 14 is removed by performing a reactive ion etching (RIE) process using the photoresist pattern 15 as a mask to form a contact window 16, and then the photoresist pattern 15 is removed.

Referring to FIG. 3c, a second conductive film 17 having a thickness of 7,000 Å is formed over the outer surface of the structure obtained in the preceding process by performing a sputtering process. The thickness of the second conductive film 17 is less in portions near the edge 14a of the insulating film 14 due to a shadow effect produced by the edge 14a. The shadow effect is described in detail in James F Smith, "Influence of DC bias Sputtering During Aluminum Metallization", Solid State Technology, pp. 135-138, January 1984.

As an improperly thin conductive film has an excessively high current density, it is subject to electromigration. The second conductive film 17 is often broken by such electromigration.

In another known process of forming a conductive film, the edge 14a of the insulating film 14 is rounded as shown in FIG. 4 to obviate such a problem. Referring to FIG. 4, the silicon substrate 11 is annealed at a temperature in the range of 800° to 1000° C. before causing the second conductive film 17 to melt and round the edge 14a, and then the second conductive film 17 is formed over the surface of the structure formed in the preceding process by using a sputtering process. This process requires a material having a high melting point, such as polycrystalline silicon, for forming the first conductive film 13.

The latter known process is comparatively more effective at improving the step coverage of the second conductive film 17; however, ions of an impurity implanted in the silicon substrate 11 are diffused excessively resulting in a deterioration of the characteristics of the transistor of the integrated circuit.

SUMMARY OF THE INVENTION

Accordingly, it is an object of the present invention to provide a process of manufacturing a semiconductor device which obviates the breakage of wiring lines formed of a conductive film.

It is another object of the present invention to provide a process of forming a conductive film having improved step coverage.

A process of manufacturing a semiconductor device according to the present invention comprises steps of: forming an insulating film having a refractive index increasing or decreasing with respect to the depth thereof over the surface of a semiconductor substrate or a first conductive film; forming a photoresist pattern over the surface of the insulating film; forming a contact window in the insulating film by selectively removing a portion of the insulating film by using the photoresist pattern as a mask; subjecting the structure formed in the preceding step to an etching process capable of etching the upper layer of the insulating film at an etching rate higher than an etching rate for the lower layer of the same; removing the photoresist pattern; and forming a second conductive film over the surface of the structure formed in the preceding step.

The above and other objects, features and advantages of the present invention will become more apparent from the following description taken in conjunction with the accompanying drawings.

DETAILED DESCRIPTION OF THE PREFERRED EMBODIMENT

FIGS. 1a through 1d show different stages of a process of manufacturing a semiconductor device, in a preferred embodiment, according to the present invention.

Figure 1A:
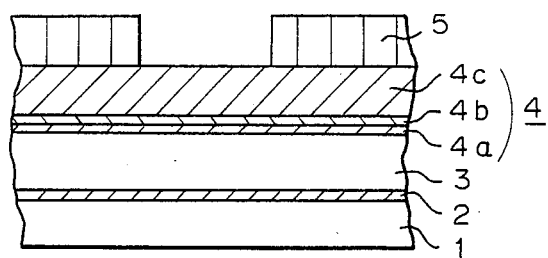
FIGS. 1a through 1d are sectional views of a process of manufacturing a semiconductor device, in a preferred embodiment, according to the present invention.

Referring to FIG. 1a, a silicon substrate 1 is subjected to a thermal oxidation process to form an SiO$_2$ film 2 over the surface thereof. A first conductive film 3 such as a polycrystalline silicon film is formed over the surface of the SiO$_2$ film 2 by performing a sputtering process. An insulating film 4 is formed effecting a plasma-activated CVD process over the surface of the first conductive film 3.

The insulating film 4 consists of a lower layer 4a and a middle layer 4b which are formed of silicon nitride, and an upper layer 4c formed of silicon nitride-oxide.

The layers 4a, 4b and 4c of the insulating film 4 are formed under plasma-activated CVD conditions tabulated in Table 1.

TABLE 1

| Layer | Lower Layer | Middle Layer | Upper Layer |
|---|---|---|---|
| Discharge power | | 1.32 | |
| Reaction pressure (torr) | | 1.0 | |
| Temperature (°C.) | | 380 | |
| Reaction time (min) | 4 | 4 | 4 |
| Gas: Flow rate (sccm) | $SiH_6$:130 $NH_3$:800 (conant) | $SiH_6$:130 $NH_3$:800–1800 (increase) | $SiH_6$:130 $NH_3$:1800–400 (decrease) $N_2O$:0–1400 (increase) $NH_3 + N_2O$:1800 (constant) |

The thickness and refractive index of the layers of the insulating film 4 are tabulated in Table 2

TABLE 2

| Layer | Lower Layer | Middle Layer | Upper Layer |
|---|---|---|---|
| Thickness (Å) | 1000 | 1000 | 6000 |
| Refractive index | 2.0 | 2.0–1.88 | 1.88–1.63 |

The respective refractive indexes of the middle layer 4b and the upper layer 4c decrease upwardly.

Then, a photoresist pattern 5 is formed over the surface of the insulating film 4 using a photolithographic process.

Figure 1B:
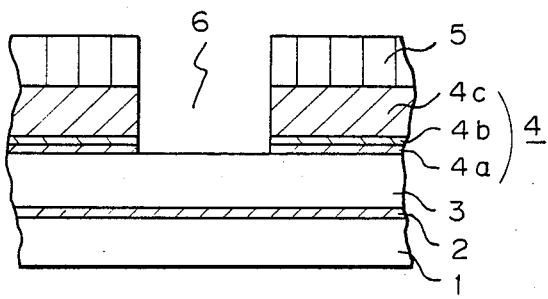

Referring to FIG. 1b, a portion of the insulating film 4 is removed selectively by performing an RIE process and by using the photoresist pattern 5 as a mask to form a contact window 6. The operating conditions during the RIE process are, for example, discharge power: 250 W, reaction pressure: 0.45 torr, $SF_6$ gas flow rate: 148 sccm, and He gas flow rate: 6 sccm.

Products formed by effecting the RIE process over the surface of the side walls of the insulating film 4 are removed by subjecting the products to a dry plasma etching process using oxygen gas for ten to twenty seconds.

Then, the structure thus formed in the preceding step is immersed in an etching solution, such as a hydrofluoric acid buffer solution (5% $HF$:$NH_4F$) for ten minutes to etch the side wall of the insulating film 4. When the first conductive film is an aluminum film, a 2:1-mixture of a hydrofluoric acid buffer solution and glacial acetic acid is used as the etching solution. The smaller the refractive index of the insulating film 4, the greater is the etching rate of etching the insulating film with the etching solution. Since the refractive index of the insulating film 4 decreases from the bottom toward the top as shown in Table 2, the etching rate is higher in the upper portion than in the lower portion of the insulating film 4.

Figure 2:
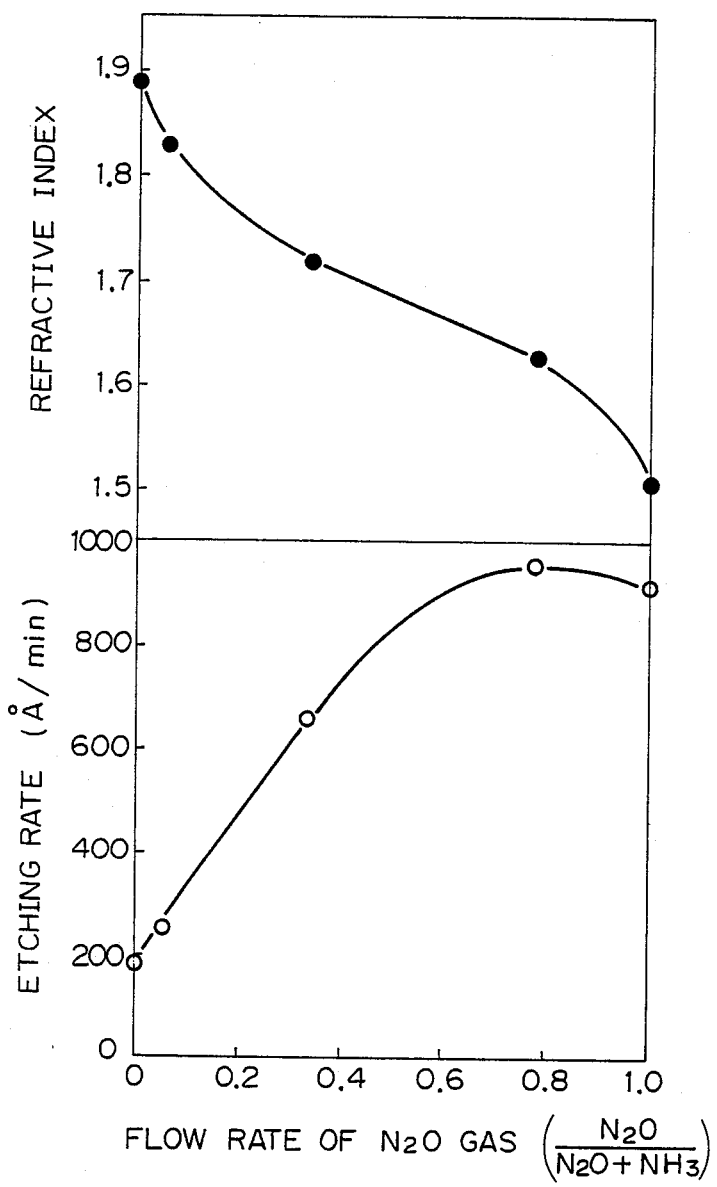
FIG. 2 is a graph showing the variation of refractive index and etching rate of a film formed by using a CVD process with the variation of the flow rate of N$_2$O gas to the flow rate of a CVD gas (N$_2$O+NH$_3$)
Figure 3A:
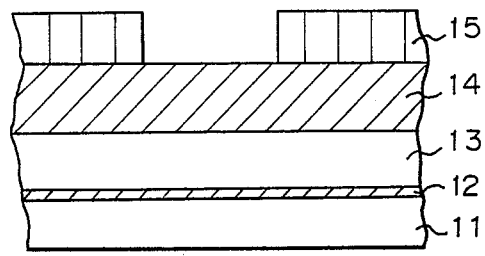
FIGS. 3a to 3c are sectional views of a conventional process of forming a conductive film.
Figure 3B:
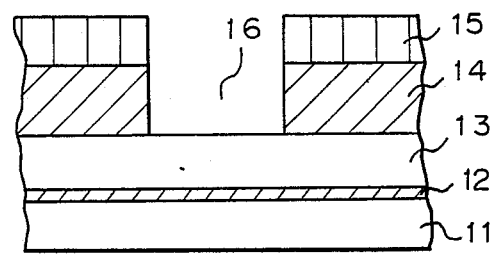
Figure 3C:
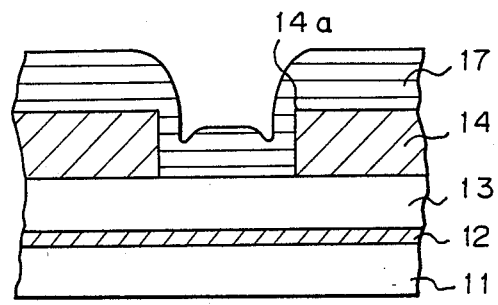
Figure 4:
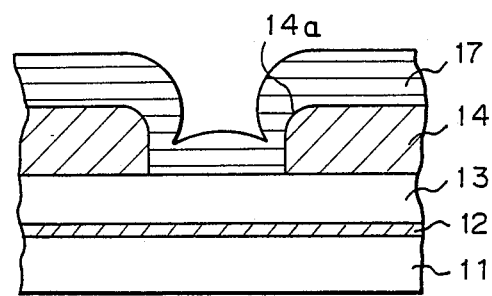
FIG. 4 is a sectional view of another conventional process of forming a conductive film.

The etching rate is 100 Å/min in the lower layer 4a, 100 Å/min to 180 Å/min in the middle layer 4b, 180 Å/min to 960 Å/min in the upper layer 4c. FIG. 2 shows the etching rate and the refractive index vs. the the flow rate ratio of $N_2O$ gas in forming the upper layer 4c of the insulating film 4.

Figure 1C:
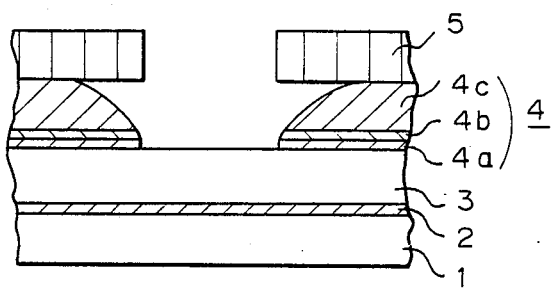

Thus, the side wall of the insulating film 4 defining the contact window 6 is etched to form a gently inclined curvilinear surface as shown in FIG. 1c. The shape of the inclined curvilinear surface can be easily and selectively determined by determining the operating conditions for forming the insulating film 4, such as the composition of the reaction gas.

Figure 1D:
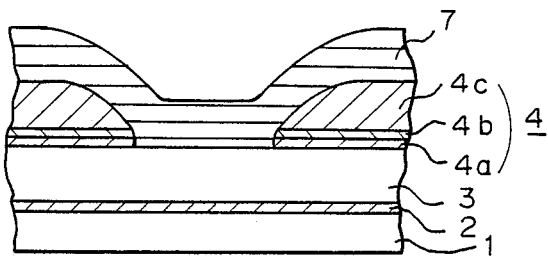

Referring to FIG. 1d, the photoresist pattern 5 is removed, and then a second conductive film 7 having a thickness of 700 Å is formed over the surface of the structure (formed in the preceding step) by using a sputtering process. Since the side wall of the insulating film 4 defining the contact window 6 comprises gently inclined curvilinear surface, the second conductive film 7 has a sufficient step coverage in the contact window.

The present invention may be practiced in other ways without departing from the spirit or essential character thereof. For example, the insulating film 4 may be formed so that the refractive index thereof increases from the bottom toward the top. In such a case, an etching solution, for example, of a nitric acid solution or a phosphoric acid solution is used for etching the insulating film 4. The mode of variation of the etching rate with such an insulating film 4 when an etching solution of a nitric acid solution or a phosphoric acid solution is used is opposite to the mode of variation shown in FIG. 2.

The side wall of the insulating film 4 may be etched by using an isotropic plasma dry etching process. The insulating film 4 having a varying refractive index decreasing from the bottom toward the top is formed by using $C_2F_6$ and $CHF_3$ as a reaction gas, while the insulating film 4 having a varying refractive index increasing from the bottom toward the top is formed by using $SH_6$ as a reaction gas.

As apparent from the foregoing description, according to the present invention, the side wall of the insulating film defining the contact window comprises a gently inclined curvilinear surface, so that the conductive film formed over the insulating film is able to provide a sufficient step coverage in the contact window. Accordingly, the present invention is capable of effectively preventing electromigration and breakage of wiring lines formed of the conductive film during the operation of the semiconductor device.

Although the invention has been described in its preferred form with a certain degree of particularity, it is to be understood that many variations and changes are possible in the invention without departing from the scope thereof.

What is claimed is:

1. A method of manufacturing a semiconductor device, said method comprising:
   providing a semiconductor substrate;
   forming a composite film, having an index of refraction that varies serially over the thickness thereof, over a surface of the semiconductor substrate, said composite film consisting of a lower film of silicon nitride having a first refractive index, a middle film of silicon nitride having a refractive index that increases over the thickness thereof in a direction toward the lower film, and an upper film of silicon nitride-oxide having a refractive index that increases over the thickness thereof in a direction toward the middle layer;
   forming a photoresist in a pattern over the insulating film;
   forming a contact window extending through the composite film and defined by a vertically extending sidewall thereof by subjecting the structure formed by performing the preceding steps to a reactive ion etching process in which the photoresist is used as a mask;

exposing the structure formed by performing the preceding steps to an etchant capable of etching the composite film so as to etch the vertically extending sidewall into an inclined surface due to the variation in the index of refraction of the insulating film;

removing the photoresist; and forming a conductive film over the composite film including the inclined surface thereof and over a surface of the substrate exposed at the bottom of the contact window.

2. A method of manufacturing a semiconductor device as claimed in claim 1, wherein the exposing of the structure to an etchant comprises exposing the structure to hydrofluoric acid buffer solution.

3. A method of manufacturing a semiconductor device, said method comprising:

providing a substrate;

forming a composite film, having an index of refraction that varies over the thickness thereof, over a surface of the substrate, said composite film consisting of a lower film of silicon nitride having a first refractive index, a middle film of silicon nitride having a refractive index that increases over the thickness thereof in a direction toward the lower film, and an upper film of silicon nitride-oxide having a refractive index that increases over the thickness thereof in a direction toward the middle layer;

removing a selected portion of the composite film to form a contact window extending through the composite film and defined by a vertically extending sidewall thereof;

exposing the structure obtained by performing the preceding steps to an etchant capable of etching the composite film so as to etch the vertically extending sidewall into an inclined surface due to the variation in the index of refraction of the composite film; and forming an upper conductive layer over the composite film including the inclined surface thereof and over a surface of the substrate exposed at the bottom of the contact window.

4. A method of manufacturing a semiconductor device as claimed in claim 3, wherein the providing of a substrate comprises providing a semiconductor substrate over which a conductive layer extends.

* * * * *